United States Patent
Miyachi et al.

(10) Patent No.: US 8,937,323 B2
(45) Date of Patent: Jan. 20, 2015

(54) LED ARRAY CAPABLE OF REDUCING UNEVEN BRIGHTNESS DISTRIBUTION

(75) Inventors: Mamoru Miyachi, Okegawa (JP); Tatsuma Saito, Yokohama (JP); Mitsunori Harada, Sagamihara (JP)

(73) Assignee: Stanley Electric Co., Ltd., Tokyo (JP)

( * ) Notice: Subject to any disclaimer, the term of this patent is extended or adjusted under 35 U.S.C. 154(b) by 92 days.

(21) Appl. No.: 13/598,951

(22) Filed: Aug. 30, 2012

(65) Prior Publication Data
US 2013/0056757 A1    Mar. 7, 2013

(30) Foreign Application Priority Data

Sep. 2, 2011 (JP) ................................. 2011-191647
Sep. 12, 2011 (JP) ................................. 2011-197999

(51) Int. Cl.
*H01L 29/18* (2006.01)
*H01L 27/15* (2006.01)
*H01L 33/20* (2010.01)
*H01L 33/38* (2010.01)

(52) U.S. Cl.
CPC .............. *H01L 27/153* (2013.01); *H01L 33/20* (2013.01); *H01L 33/385* (2013.01); *H01L 33/387* (2013.01)
USPC ...................................... 257/88; 257/E25.02

(58) Field of Classification Search
CPC ..... H01L 27/153; H01L 33/20; H01L 33/387; H01L 33/385
USPC .................................. 257/88, E25.02; 313/13
See application file for complete search history.

(56) References Cited

U.S. PATENT DOCUMENTS 6,163,036 A * 12/2000 Taninaka et al. ................ 257/88
2011/0316009 A1* 12/2011 Fukasawa ....................... 257/88

FOREIGN PATENT DOCUMENTS

JP     2001-156331 A    6/2001

* cited by examiner

*Primary Examiner* — Benjamin Sandvik
*Assistant Examiner* — Farid Khan
(74) *Attorney, Agent, or Firm* — Holtz, Holtz, Goodman & Chick PC

(57) ABSTRACT

A light emitting element in use for an LED array comprises an electrode layer, a semiconductor light emitting layer consisting of a p-type semiconductor layer, an active layer and an n-type semiconductor layer, a first wiring layer formed along and in parallel to one side of the semiconductor light emitting layer, and a plurality of second wiring layers extending from the first wiring layer to the semiconductor light emitting layer and electrically connected to the n-type semiconductor layer on a surface of the semiconductor light emitting layer, wherein a plane shape of the semiconductor light emitting layer comprises two short sides including a portion inclined from a line perpendicular to a upper and a lower sides, and a vertical line from a vertex where the upper side and the short side meet crosses the lower side of the adjacent light emitting element.

9 Claims, 10 Drawing Sheets

LED ARRAY CAPABLE OF REDUCING UNEVEN BRIGHTNESS DISTRIBUTION

CROSS-REFERENCE TO RELATED APPLICATION

This application is based on Japanese Patent Application 2011-191647, filed on Sep. 2, 2011 and Japanese Patent Application 2011-197999, filed on Sep. 12, 2011, the entire contents of which are incorporated herein by reference.

BACKGROUND OF THE INVENTION

A) Field of the Invention

This invention relates to a semiconductor light emitting element array and an automotive lighting using the semiconductor light emitting element arrays.

B) Description of the Related Art

High power is required for a light emitting diode (LED) element for use in headlamps for vehicles, illuminations or the likes. If a size of the element is simply enlarged, a driving electric current becomes too large and it becomes difficult to flow an electric current uniformly in the element. Therefore, in order to obtain a high power LED, a plurality of LED elements are arranged in a series to form an LED array (for example, refer to Japanese Laid-open Patent Publication No. 2001-156331).

In application of headlamps for vehicles or the likes, an oblong LED array is required. However, increase in the number of LED elements is not preferable because a proportion of non-light-emitting regions between the elements increases. Thus a shape of each LED element in an LED array becomes an oblong.

FIG. 10A is a schematic plan view showing a conventional LED array 600, and FIG. 10B is a simplified cross sectional view of the LED array 600 shown in FIG. 10A.

Generally the conventional LED array 600 has four nitride semiconductor light emitting elements arranged and connected in a series on an insulating supporting substrate. In case of GaN-based white LED element, LED structures are formed on a sapphire substrate, a supporting substrate is adhered, the sapphire substrate is separated, and electrodes are formed.

Each LED element 601 has a GaN-based light emitting part 602 consisting of an n-type GaN layer 621, an active layer 622 and a p-type GaN layer 623, a p-electrode 612 formed on a back surface of the light emitting part 602, a wiring electrode (first wiring layer) 611 arranged on a right short side of the light emitting part 602 with a predetermined interval in parallel to the short side, and wiring electrodes (second wiring layers) 608 arranged on a surface of the light emitting part 602 in parallel to a long side of the light emitting part 602 and connecting the n-type GaN layer 621 with the wiring electrodes 611. The LED elements 601 adjacent horizontally (in a longitudinal direction of the LED elements 601) are connected with each other by forming the wiring electrode 611 of one (left-side) LED element 601 on the p-electrode 612 of the adjacent (right-side) LED element 601 in order to connect the n-type GaN layer 621 of the left-side element with the p-type GaN layer 623 of the right-side element.

A phosphor layer 631 seals the plurality of the LED elements 601 mounted on a substrate 630. For example, when the LED elements 601 are blue LED elements, a white LED array 600 can be fabricated by a combination of the blue LED elements and yellow phosphor. In this case, the yellow phosphor is added to transparent resin in advance, and the LED elements 601 are sealed by the transparent resin added with the phosphor.

Moreover, hatching of the light emitting part 602 in FIG. 10A indicates brightness distribution wherein increase in density of hatching indicates increase in brightness.

When the wiring electrode 611 is arranged in parallel to the short side of the LED element 601 and the wiring electrodes 608 on the n-type GaN layer 621 are arranged in parallel to the long side of the LED element 601, a length of the wiring electrode 608, for example, with a width of about 10 μm becomes long and its wiring resistance becomes large. Therefore, an injection current decreases from the right power supply side to the left side and it generates uneven brightness distribution.

Moreover, because the wiring electrode 611 with a width of about 40 μm is disposed between the LED elements 601, the interval between the LED elements 601 becomes wide and the brightness decreases; therefore, uneven brightness distribution is generated between the central and the peripheral areas of the element. If a headlamp or the likes is manufactured with the LED array 600 consisting of the above-described conventional LED elements 601, the uneven brightness is generated in a projection image.

FIG. 10C and FIG. 10D are diagrams showing the brightness distributions of the LED array 600 along the line e-f in FIG. 10A. FIG. 10C shows the brightness distribution along the line e-f of the LED array 600 without the phosphor layer 631 as a blue LED array, and FIG. 10D shows the brightness distribution along the line e-f of the LED array 600 with the phosphor layer 631 as a white LED array.

As shown in FIG. 10 C, without the phosphor layer 631 when blue light is emitted, a surface of the conventional element has a flat brightness distribution. However, after making the blue LED element emit white light by forming the phosphor layer 631 on the blue LED element having the flat brightness distribution, the brightness (maximum brightness) in the vertical center (center of the direction H in the drawing) becomes about 1.2 to 1.67 times of the brightness (reference brightness) at the edges. Therefore, the brightness distribution (lambertian distribution) in which the brightness gradually decrease from the center to the edge. By using this type of LED array 600 to compose a headlamp or the likes, uneven brightness distribution is generated in a projection image.

SUMMARY OF THE INVENTION

It is an object of the present invention to provide a semiconductor light emitting element array capable of reducing uneven brightness distribution.

It is another object of the present invention to provide an automotive lighting capable of reducing uneven brightness in a projection image.

According to one aspect of the present invention, there is provide a semiconductor light emitting element array wherein a plurality of semiconductor light emitting elements are disposed on an oblong substrate that is long in a first direction, each one of the light emitting elements comprising: an electrode layer formed on the substrate; a semiconductor light emitting layer formed on the electrode layer, comprising a p-type semiconductor layer electrically connected to the electrode layer, an active layer formed on the p-type semiconductor layer and an n-type semiconductor layer formed on the active layer; a first wiring layer formed along and in parallel to one side of the semiconductor light emitting layer; and a plurality of second wiring layers extending from the first wiring layer to the semiconductor light emitting layer and electrically connected to the n-type semiconductor layer on a surface of the semiconductor light emitting layer, wherein a plane shape of the semiconductor light emitting layer comprises upper and lower sides parallel to the first direction and two short sides including a portion inclined from a line perpendicular to the upper and the lower sides, and a vertical line from a vertex where the upper side and the short side meet crosses the lower side of the adjacent light emitting element.

According to another aspect of the present invention, there is provided a semiconductor light emitting element array wherein a plurality of semiconductor light emitting elements are disposed on an oblong substrate that is long in a first direction, each one of the light emitting elements comprising: an electrode layer formed on the substrate; a semiconductor light emitting layer formed on the electrode layer, comprising a p-type semiconductor layer electrically connected to the electrode layer, an active layer formed on the p-type semiconductor layer and an n-type semiconductor layer formed on the active layer; a first wiring layer formed along and in parallel to one side of the semiconductor light emitting layer; a plurality of second wiring layers extending from the first wiring layer to the semiconductor light emitting layer and electrically connected to the n-type semiconductor layer on a surface of the semiconductor light emitting layer; and a phosphor layer formed above the semiconductor light emitting layer, wherein a plane shape of the semiconductor light emitting layer comprises a base parallel to the first direction and at least one side including a portion inclined from a line perpendicular to the base, and a width of the semiconductor light emitting layer in the first direction decreases from the base.

According to the present invention, there is provided a semiconductor light emitting element array capable of reducing uneven brightness distribution.

Moreover, according to the present invention, there is provided an automotive lighting capable of reducing uneven brightness in a projection image.

DESCRIPTION OF THE PREFERRED EMBODIMENTS

Figure 1A:
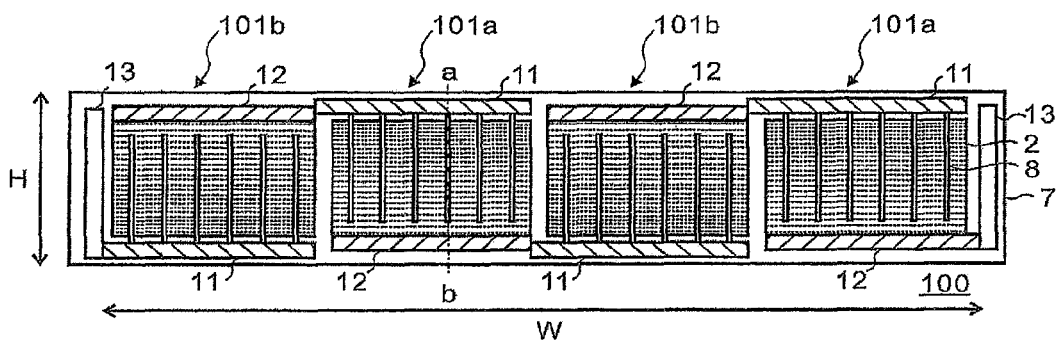
FIG. 1A to FIG. 1D are schematic plan views, circuit diagram and cross sectional view of an LED array 100 and LED elements 101 according to a first embodiment of the present invention.
Figure 1B:
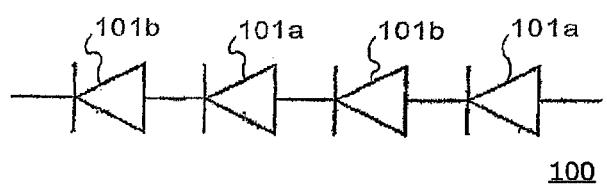
Figure 1C:
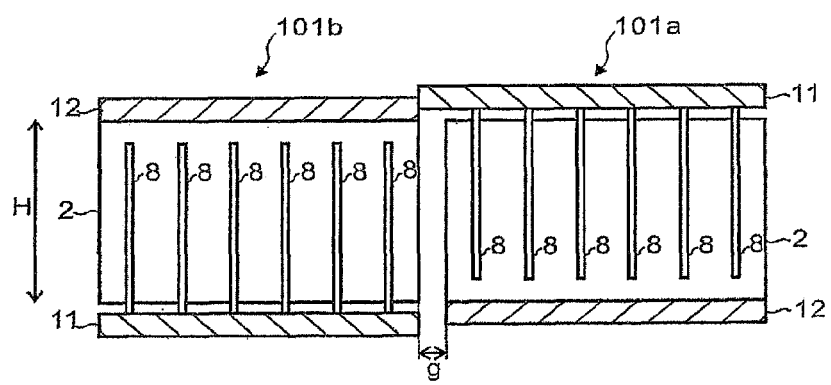
Figure 1D:
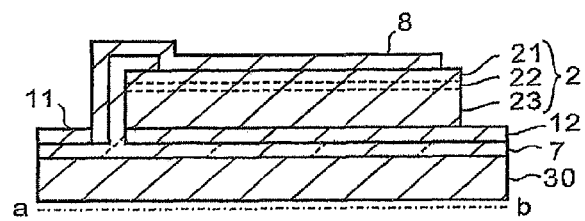

FIG. 1A is a schematic plan view of an LED array 100 according to a first embodiment of the present invention, and FIG. 1B is a circuit diagram of the LED array 100. FIG. 1C is a schematic plan view of LED elements 101a and 101b composing the LED array 100. FIG. 1D is a simplified cross sectional view of the LED array 100 cut along a line a-b in FIG. 1A. Moreover, hatching of the light emitting part 2 in FIG. 1A indicates brightness distribution wherein increase in density of hatching indicates increase in brightness.

The LED (light emitting diode) array (light emitting element array) 100 according to the first embodiment of the present invention is an array of four nitride semiconductor light emitting elements (LED elements) 101 (101a and 101b) connected in series and arranged along a W direction in the drawing on a supporting substrate 30 which is long in the W direction and on which an insulating layer 7 is formed. Each one of the LED elements 101 is an oblong which is long in the W direction and consists of a GaN-based light emitting part (device structure layer) 2 including an n-type GaN layer 21, an active layer 22 and a p-type GaN layer 23, a p-electrode 12 formed on a back surface of the light emitting part 2 and exposed (or projecting) from one of top and bottom long sides of the light emitting part 2, a wiring electrode (first wiring layer) 11 disposed in parallel to the long side at a position with a predetermined interval from another long side of the light emitting part 2, which is opposite from the one side where the p-electrode 12 is exposed, and wiring electrodes (second wiring layers) 8 disposed on a surface of the light emitting part 2 in parallel to a short side of the light emitting part 2 and connecting the n-type GaN layer 21 and the wiring electrode 11.

Each LED element 101 is electrically connected in series to the LED elements 101 adjacent to its left and right. The wiring electrode 11 of the LED element 101a is electrically connected to the p-electrode 12 of the LED element 101b on the left, and the p-electrode 12 of the LED element 101a is electrically connected to the wiring electrode 11 of the LED element 101b on the right. The p-electrode 12 of the LED element 101a at the end and the wiring electrode 11 of the LED element 101b at the end are electrically connected to power supply pads 13 respectively.

Regarding the LED element 101a, an injection current gradually decreases from the top to the bottom of the drawing because the wiring electrode 11, the power supply side, is disposed on the upper long side of the light emitting part 2 in parallel to the upper long side, and the wiring electrodes 8 extend from the wiring electrode 11 to the n-type GaN layer 21 in parallel to the short side of the light emitting part 2. Therefore, the LED element 101a has a brightness distribution wherein the upper side is bright and the lower side is dark. However, because a length of each wiring electrode 8 becomes shorter than that in the prior art shown in FIG. 10 by arranging the wiring electrodes 8 in parallel to the short side of the light emitting part 2, decrease in the injection current and unevenness in the brightness distribution can be reduced.

That is, on a light emitting surface of the LED element 101a is formed a brightness distribution that has a peak (the maximum brightness point) near the wiring electrode 11 and wherein the brightness gradually decreases as it goes further from the wiring electrode 11 downward (to a direction H) in the drawing.

Although the similar brightness distribution is formed on the light emitting surface of the LED element 101b as the LED element 101a, the wiring electrode 11 is formed along the lower long side of the LED element 101b. Therefore, contrary to the light emitting surface of the LED element 101a, the light emitting surface of the LED element 101b has the brightness distribution that has a peak (the maximum brightness point) near the lower long side and wherein the brightness gradually decreases as it goes upward in the drawing. Moreover, the LED element 101a and the LED element 101b basically has the same structures except the electrode patterns such as positions of the p-electrodes 12, wiring electrodes 11 and the wiring electrodes 8. The electrode pattern of the LED element 101b is upside-down (180-degree rotational symmetry) of that of the LED element 101a.

High power is required for LED elements to be used in headlamps of vehicles or illuminations. If simply a size of the element is enlarged, a driving voltage increases and it becomes difficult to flow an electric current uniformly. Therefore, in the first embodiment, a plurality of the LED elements 101 are arrayed to form the LED array 100. It is preferable to connect the LED elements 101 in series for flowing the same electric current in all the LED elements 101.

Moreover, in case of using the LED array in a headlamp of a vehicle, it is required to illuminate near the ground surface, and so it is preferable to shape the LED array 100 in an oblong that is long in a horizontal direction (a direction W in the drawing). A size of the LED array 100 is, for example, 5 mm or more in width and 1 mm or less in height. In case of arraying four LED elements 101, it is efficient to use LED elements each of which is an oblong that is long in a horizontal direction and short in a vertical direction (long in the direction W and short in the direction H).

Furthermore, when the narrow wiring electrodes 608 with a width of about 10 µm are disposed on the light emitting surface of the horizontal oblong LED element 101 in parallel to the long side as shown in FIG. 10, a ratio of wiring resistance of the narrow wiring electrodes 608 (e.g., with a width of 10 µm) to the resistance of the semiconductor layer (light emitting part) becomes large, an unevenness of the electric current distribution in the semiconductor layer 602 becomes large and so the brightness distribution becomes considerably uneven.

Thus, according to the embodiment, the electrode structure (electrode pattern) as shown in FIG. 1A and FIG. 1C is adopted, wherein a wide wiring electrode (first wiring layer) 11 with a width of 20 µm to 200 µm (preferably about 40 µm) is disposed in parallel to the long side of each LED element 101, and the narrow wiring electrodes (second wiring electrodes) 8 are disposed in parallel to the short side for reducing the unevenness of the electric current distribution by reducing the length of the electrodes. With this electrode pattern, the wiring resistance is reduced by shortening the length of the wiring electrodes 8, and the unevenness of the brightness distribution in each LED element 101 can be significantly reduced.

Although unevenness of the brightness distribution in each LED element 101 and the brightness distribution in the LED array 100 caused by the decrease in the brightness around the intervals between LED elements 101 can be significantly reduced by adopting the electrode pattern according to the embodiment, unevenness of the brightness distribution is still found in a projection image of a headlamp or the likes that uses the LED array 100 if the plurality of the LED elements 101 are simply arrayed to form the array. In order to further reduce the unevenness of the brightness distribution, according to the first embodiment, as shown in FIG. 1A, the brightness distributions of adjacent LED elements 101 are alternatively changed, for example, alternatively upside down (rotated by 180 degrees) as shown in the drawing.

That is, the LED elements 101a and LED elements 101b are alternatively disposed along the long side of the LED array 100. Each LED element 101a has the wiring electrode (first wiring layer) 11 disposed along one long side of the light emitting part 2 (the lower long side in FIG. 1A and FIG. 1C) and the wiring electrodes (second wiring layer) 8 extending from the one long side to vicinity of another long side, whereas each LED element 101b has the wiring electrode (first wiring layer) 11 disposed along the another long side of the light emitting part 2 (the upper long side in FIG. 1A and FIG. 1C) and the wiring electrodes (second wiring layer) 8 extending from the another long side to vicinity of the one long side.

By alternatively disposing the LED elements 101a and 101b as in the above, the adjacent LED elements 101a and 101b have upside-down brightness distributions (180-degree rotational symmetry) to reduce the uneven brightness distribution in the LED array 100 as a whole.

Moreover, because the wiring electrode 11 is disposed along the long side of the LED element 101, comparing to the prior art disposing it along the short side, the interval g between the LED elements can be narrow, for example, around 30 µm. Therefore, the decrease in brightness in a region near the interval between the LED elements 101 can be further restrained.

Figure 2A:
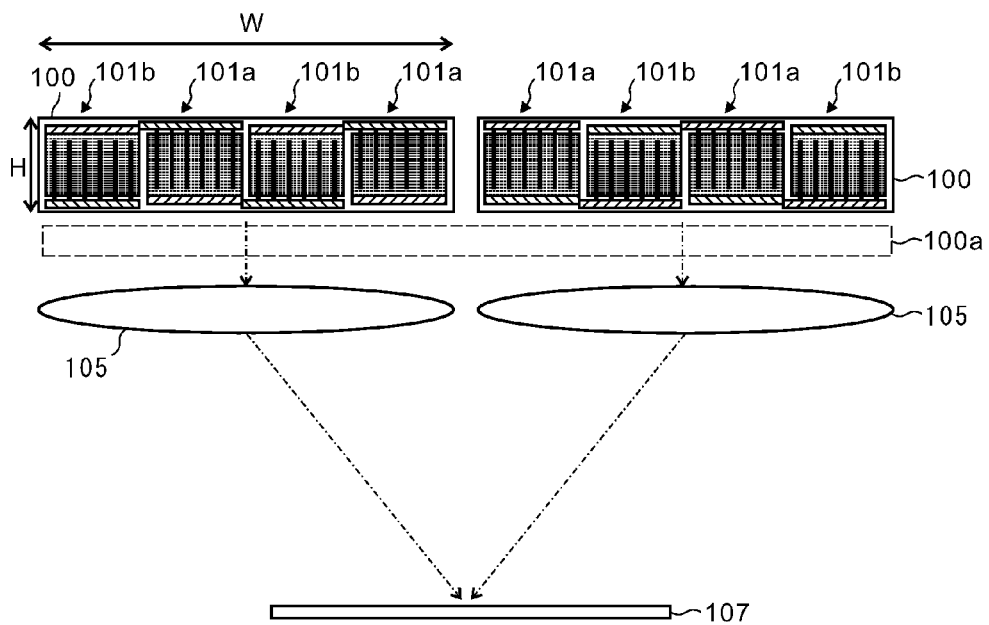
FIG. 2A and FIG. 2B are diagrams showing structures of automotive lightings (headlamps) 50 equipped with the LED arrays 100 according to the embodiment of the present invention.
Figure 2B:
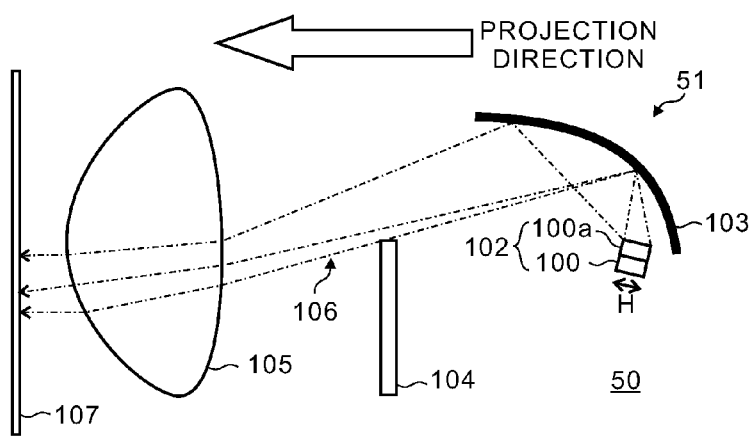

FIG. 2A and FIG. 2B are diagrams showing structures of automotive lightings (headlamps) 50 equipped with the LED arrays 100 according to the first embodiment of the present invention. The LED arrays 200 to 300 according to the later-described second and third embodiments can be used instead of the LED arrays 100 according to the first embodiment.

FIG. 2A shows an example of a projection optical system 51 equipped with at least two LED arrays 100 and at least two projection lenses 105 each of which corresponds to each LED array 100. The projection lenses 105 are positioned to make optical source images 106 of the LED arrays 100 having mirrored electrode patterns overlap with each other on a virtual vertical screen (projection surface) 107 which faces a front of a vehicle. When one LED array 100 has the LED elements 101b, 101a, 101b and 101a horizontally lined up in this order as shown in FIG. 1A and another LED array 100 is a mirror image of that shown in FIG. 1A, i.e., the another LED array 100 has the LED elements 101a, 101b, 101a and 101b horizontally lined up in this order, a projection image of the LED element 101a having a brightness distribution which gradually becomes darker from the top to the bottom and a projection image of the LED element 101b having a brightness distribution which gradually becomes brighter from the top to the bottom are overlapped with each other on the projection surface 107. Therefore, the uneven brightness can be reduced.

Moreover, as shown in FIG. 2B, the projection optical system 51 can be equipped with a multireflector (a reflection surface) 103 to share one projection lens with a plurality of LED arrays 100.

The headlamp 50 shown in FIG. 2B consists of a light source 102 consisting of at least two LED arrays whose electrode patterns are horizontally mirrored and a phosphor layer (wavelength transformation layer) 100a and a projection optical system 51 consisting of a reflection surface 103 that is a multireflector divided into a plurality of small reflection regions, a shade 104 and a projector lens 105.

As shown in FIG. 2B, the light source 102 is positioned to make its projecting direction (light emitting surface) upward. The reflection surface 103 is a spheroidal reflection surface whose first focal point is set to near the light source 102 and second focal point is set to neat the upper edge of the shade 104, and it is positioned to cover the side and the front of the light source 102 so that light from the light source 102 irradiates to the reflection surface 103.

As shown in FIG. 2B, the reflection surface 103 projects the light source images 106 of the plurality of the LED arrays 100 of the light source 102 to the front of a vehicle and is designed to project the light source images 106 of two LED arrays 100 whose electrode patterns are mirrored horizontally to the same position on the virtual vertical screen (projection surface) 107 which faces the front of the vehicle in order to overlap the images.

The shade 104 is a shading part for shading a portion of reflected light from the reflection surface 103 to form a cutoff line suitable for a headlamp. The shade 104 is disposed between the projection lens 105 and the light source 102 with placing its upper edge near the focal point of the projection lens 105.

The projection lens 105 is positioned on the front of the vehicle and irradiates the reflected light from the reflection surface 103 onto the projection surface 107.

As in the above, by using two LED array 100 whose electrode patterns (brightness distributions) are mirrored horizontally (180-degree rotational symmetry) and by designing the headlamp 50 to make their projection images overlap on the projection surface 107, it becomes possible to further reduce the uneven brightness distribution.

Below describes a method for fabricating the LED array 100 according to the first embodiment of the present invention with reference to FIG. 3 and FIG. 4. FIG. 3 and FIG. 4 are schematic cross sectional view of the nitride semiconductor light emitting element (LED element) 101a cut along the line a-b in FIG. 1. Although only one LED element 101 is depicted in FIG. 3 and FIG. 4, practically at least four of the LED elements 101a and 101b are alternatively arranged on the same substrate. Moreover, the method described below is just an example, and a fabricating method of the LED array 100 is not limited to that. Furthermore, the LED arrays 200 and 300 according to the later-described second and third embodiments can be fabricated by the similar processes.

Figure 3A:
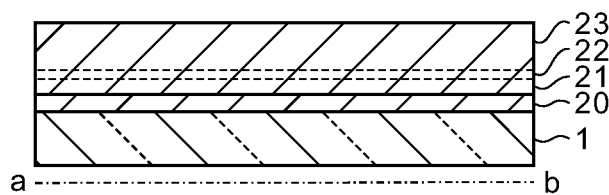
FIG. 3A to FIG. 3F are schematic cross sectional views for explaining one manufacturing method of the LED array 100 according to the first embodiment of the present invention.

First, as shown in FIG. 3A, a transparent substrate 1 made of sapphire is prepared, and a device structure layer (GaN-based light emitting part) 2 consisting of nitride semiconductors is formed by using a metal organic chemical vapor deposition (MOCVD) technique. For example, after disposing the sapphire substrate 1 into a MOCVD apparatus, thermal cleaning is performed. Thereafter, GaN buffer layer 20 is grown, and thereon an n-type GaN layer 21 doped with Si or the like with a thickness of about 5 μm, a multi-quantum well light emitting layer (active layer) 22 including an InGaN quantum well layer, a p-type GaN layer 23 doped with Mg or the like with a thickness of about 0.5 μm are sequentially grown to form the GaN-based light emitting part 2. The sizes of the components shown in the cross sectional views in FIG. 3 and FIG. 4 are modified for convenience of the explanation. The transparent substrate 1 is a monocrystalline substrate with a lattice constant capable of epitaxial growth of GaN and selected from material that is transparent to light with a wavelength of 362 nm, which is an absorption edge wavelength of GaN in order to remove the substrate by a laser-lift-off process later on. As the transparent substrate 1, spinel, SiC, ZnO or the like can be used instead of the sapphire.

Figure 3B:
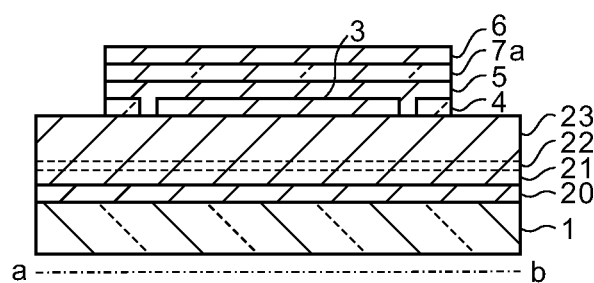

Next, as shown in FIG. 3B, an Ag layer with a thickness of 200 nm is formed on a surface of the device structure layer 2 (surface of the p-type GaN layer 23) by the electron beam evaporation technique and patterned by photolithography to form a p-electrode layer (first electrode layer) 3. Thereafter, an etch-stop layer 4 made of $SiO_2$ with the same thickness as the p-electrode layer 3 is formed by using the sputtering technique. The etch-stop layer 4 functions as an etch stopper in the later-described etching process shown in FIG. 4B.

Then, a diffusion barrier layer 5 made of TiW with a thickness of 300 nm is formed in a region including the p-electrode layer 3 and the etch-stop layer 4 by using the sputtering technique. The diffusion barrier layer 5 prevents diffusion of material of the p-electrode layer 3, and Ti, W, Pt, Pd, Mo, Ru, Ir and their alloys can be used for forming the diffusion barrier layer 5 when the p-electrode layer 3 includes Ag. Continuously, an insulating layer 7a made of $SiO_2$ is formed on the diffusion barrier layer 5 by the sputtering technique or the like, and thereon a first bonding layer 6 made of Au with a thickness of 200 nm is formed by using the electron beam evaporation technique.

Figure 3C:
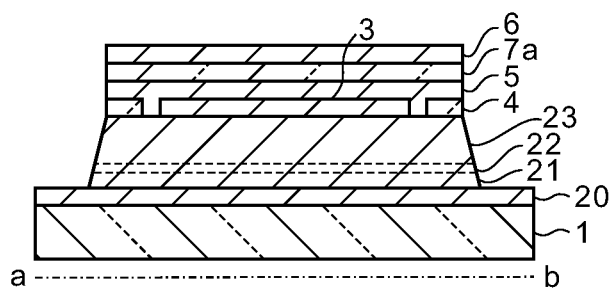

Next, as shown in FIG. 3C, the device structure layer 2 is divided into a plurality of oblong elements by the dry-etching technique using a resist mask and chlorine gas. Side surfaces of the divided device structure layer 2 are inclined, and the divided device structure layer 2 is in a shape whose areas of horizontal cross sections decrease from the bottom to the top. In this process, the interval g between the elements (FIG. 1C) is set to 150 μm or less, and preferably set to about 30 μm.

Figure 3D:
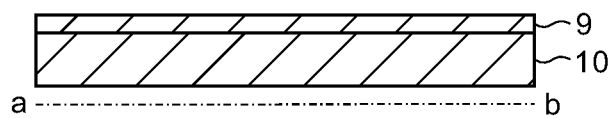

Next, as shown in FIG. 3D, a supporting substrate 10 made of Si is prepared, and thereon a second bonding layer 9 made of AuSn (Sn: 20 wt %) with a thickness of 1 μm is formed by using the resistive heating evaporation. The supporting substrate 10 is preferably made of material having a coefficient of thermal expansion that is close to that of sapphire or GaN and high thermal conductivity. For example, Si, AlN, Mo, W, CuW or the likes can be used for the supporting substrate 10.

The material for the first bonding layer 6 and the second bonding layer 9 can be selected from metals capable of fusion bonding such as metal including Au—Sn, Au—In, Pd—In, Cu—In, Cu—Sn, Ag—Sn, Ag—In, Ni—Sn or the likes and from metals including Au, which is capable of diffusion bonding.

Figure 3E:
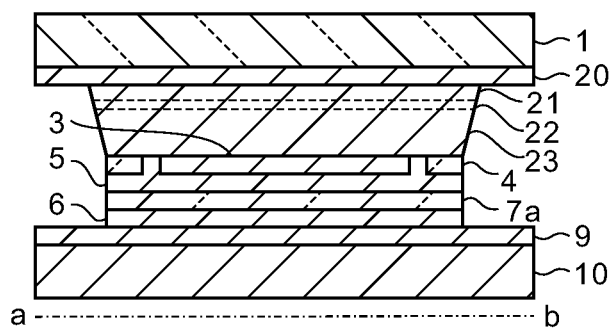

Next, as shown in FIG. 3E, the first bonding layer 6 and the second bonding layer 9 are fusion-bonded by contacting each other, heating them to 300 degrees Celsius under the pressure of 3 MPa for ten minutes and then cooling them down to a room temperature.

Figure 3F:
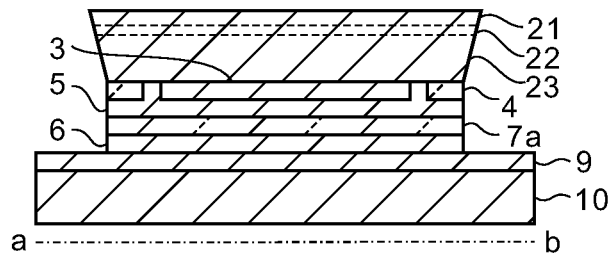

Thereafter, the buffer layer 20 is decomposed by heating by irradiating a light of an UV Excimer laser to the sapphire substrate 1 from the back, as shown in FIG. 3F, to perform a peeling-off process of the sapphire substrate 1 by the laser lift off technique. The peeling-off or removal of the substrate 1 can be performed by other process such as etching or the likes.

Figure 4A:
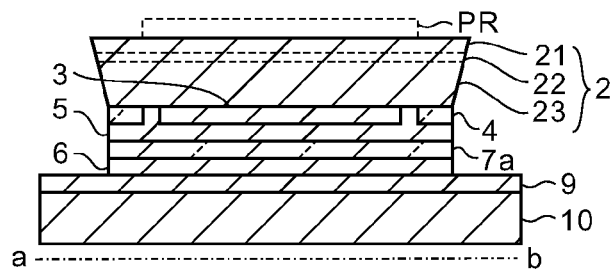
FIG. 4A to FIG. 4D are schematic cross sectional views for explaining one manufacturing method of the LED array 100 according to the first embodiment of the present invention.
Figure 4B:
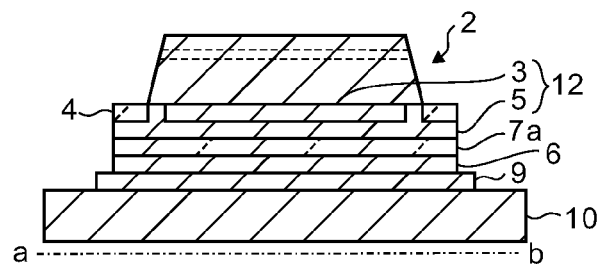

Next, as shown in FIG. 4A, a photoresist PR exposing edges the device structure layer 2 is formed. Then, by the dry-etching technique using chlorine gas, the edges of the device structure layer 2 exposed from the photoresist PR are etched until the ethic-stop layer 4 is exposed. Thus, as shown in FIG. 4B, the side walls of the device structure layer 2 are inclined, and so the shape of the device structure layer 2 becomes a tapered shape whose cross sections decrease upward from the supporting substrate 10.

Figure 4C:
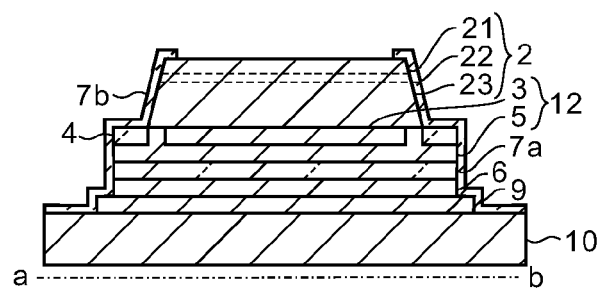

Next, as shown in FIG. 4C, a protection film (insulating film) 7b made of $SiO_2$ is formed on all over the upper surface of the element fabricated by the above-described processes by the sputtering technique or the like, and then a portion of the protection film 7b formed on the device structure layer 2 is etched by using buffered hydrogen fluoride to expose a portion of the surface of the device structure layer 2 (surface of the n-type GaN layer 21) exposed by the peeling-off of the transparent substrate 1.

Figure 4D:
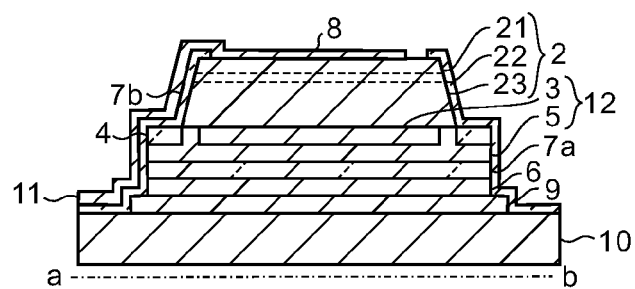
Figure 7A:
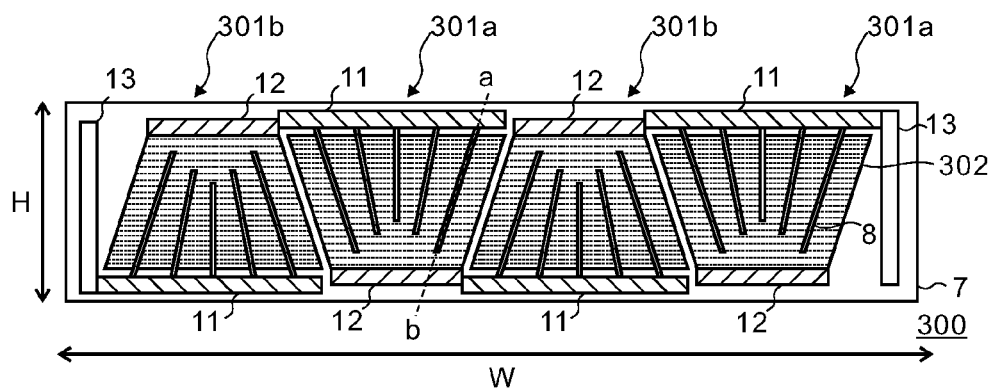
FIG. 7A and FIG. 7B are schematic plan views of an LED array 300 and LED elements 301 according to a third embodiment of the present invention.
Figure 7B:
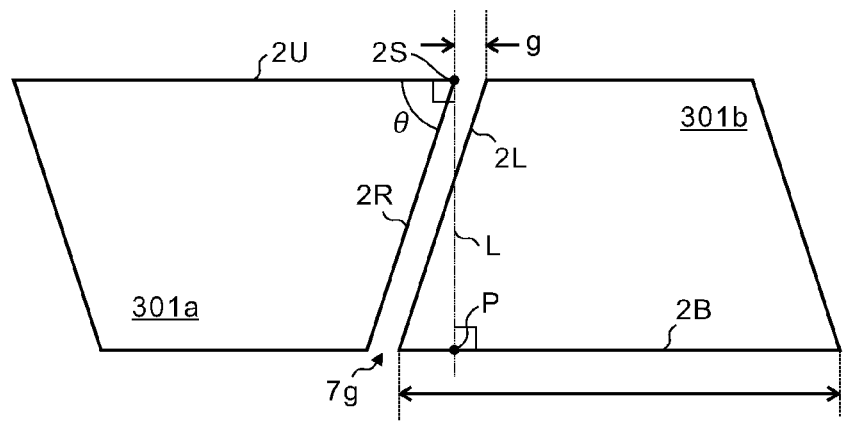

Next, as shown in FIG. 4D, a Ti layer with a thickness of 10 nm, an Al layer with a thickness of 300 nm and an Au layer with a thickness of 2 μm are sequentially formed in this order by using the electron beam evaporation technique and patterned by the lift-off technique to simultaneously form a wiring electrode (first wiring layer) 11 with a width of, for example, about 40 μm at a position near the long side of the device structure layer 2 in parallel to that long side and wiring electrodes (second wiring electrodes) 8 with a width of, for example, about 10 μm in parallel to the short side and electrically connected to the wiring electrode 11. The width of the wiring electrode 11 is preferably 20 μm to 200 μm. Moreover, the width of the wiring electrodes 8 is preferably 3 μm to 20 μm. Furthermore, the width of the wiring electrode 11 is preferably wider than the width of the wiring electrodes 8. Although the wiring electrodes 8 are formed in parallel to the short side of the LED element 101 and perpendicular to the long side of the LED element 101; the wiring electrodes 8 are not necessarily formed in parallel to the short side if they are not parallel to the long side as in the later described electrode pattern according to the third embodiment (FIG. 7A and FIG. 7B).

The wiring electrodes 11 of the adjacent elements are formed near the different long sides. The wiring electrodes 8 are electrically connected to the portion of the surface of the device structure layer 2 (surface of the n-type GaN layer 21) exposed by the above-described processes. The wiring electrodes 8 connected to the n-side (n-type GaN layer 21) are formed on the surface of the n-type GaN layer 21 so that a plane shape of those is a comb shape in which the wiring electrode 11 is a base and the wiring electrodes 8 are teeth as shown in FIG. 1A in order not to decrease the brightness.

The wiring electrode 11 is preferably positioned outside the area of the device structure layer 2 in order not to prevent light extraction from the device structure layer 2. However, if it is positioned too far from the device structure layer 2, wiring resistance in the wiring electrodes 8 becomes high. Therefore, it is preferable to set an interval between the wiring electrode 11 and the long side of the device structure layer 2 within 50 μm. The wiring electrode 11 is connected to the p-electrode layer 3 of the adjacent element to form the light emitting element array 100 wherein a plurality of the elements are connected in series. In case of fabricating a plurality of the LED arrays 100 from one substrate, the element isolation is performed by braking after scribing.

Figure 5:
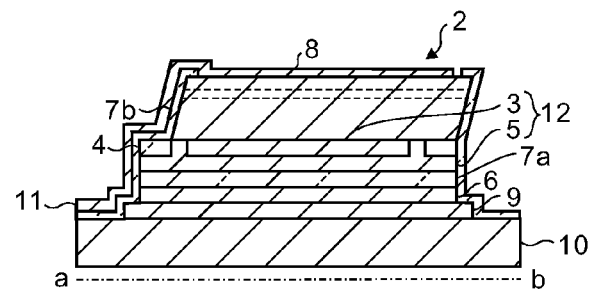
FIG. 5 is a schematic cross sectional view for explaining another manufacturing method of the LED array 100 according to the first embodiment of the present invention.

Moreover, the device structure layer 2 may be processed to have only one long sidewall spreading outside toward the bottom as shown in FIG. 5. In this case, the photoresist exposing only one long side of the device structure layer is formed at the photoresist formation process shown in FIG. 4A, and the exposed one long side of the device structure layer 2 is etched to spread outside toward the bottom by the dry-etching technique using chlorine gas at the etching process shown in FIG. 4B. Moreover, the wiring electrodes 8 are formed on the slanted surface of the etched long side. Further, the adjacent LED elements 101 have the slanted surface spreading outside toward the bottom on the different long sides.

Figure 6A:
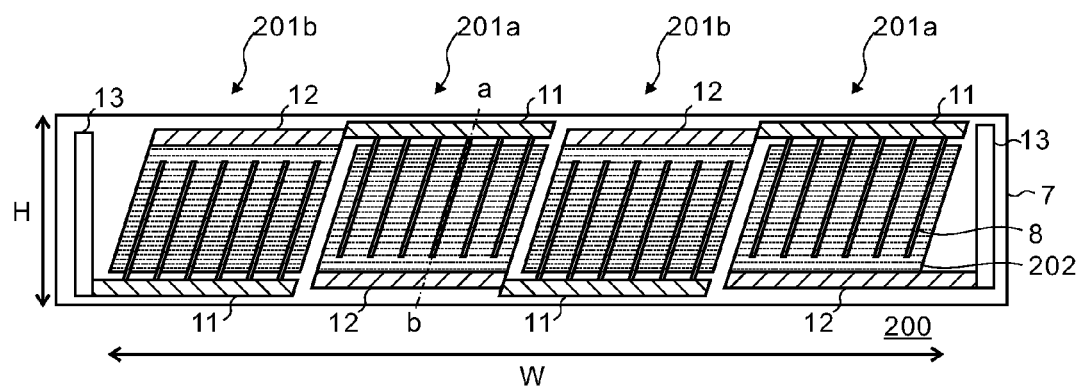
FIG. 6A and FIG. 6B are schematic plan views of an LED array 200 and LED elements 201 according to a second embodiment of the present invention.
Figure 6B:
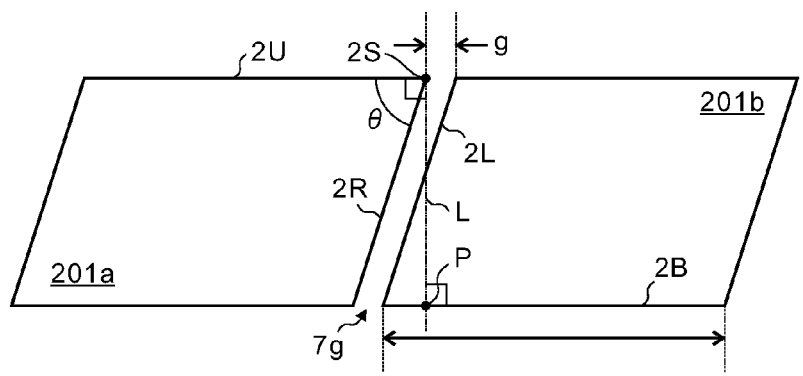

FIG. 6A is a schematic plan view of an LED array 200 according to a second embodiment of the present invention, and FIG. 6B is a schematic plan view of LED elements 201a and 201b for explain a plane shape of a light emitting surface of the LED array 200. The LED array 200 according to the second embodiment and the LED array 100 according to the first embodiment are different in the plane shapes of the LED elements and in the electrode patterns of the wiring electrodes 8, and other components of them and fabrication methods are the same. The below describes the plane shape of the LED element 201 and the electrode pattern of the wiring electrodes 8, and the explanations of the same components and processes are omitted.

In the second embodiment, by making the plane shape of the light emitting surface of the device structure layer 2 a parallelogram, each gap 7g between the LED elements 201 is angled in a plane of the projection surface. The LED element 201a is a 180-degree rotational symmetry of the LED element 201b. Similarly to the first embodiment, on a light emitting surface of the LED element 201a is formed a brightness distribution that has a peak (the maximum brightness point) near the wiring electrode 11 and wherein the brightness gradually decreases as it goes further from the wiring electrode 11 downward (to the direction H) in the drawing. Although the similar brightness distribution is formed on the light emitting surface of the LED element 201b as the LED element 201a, the wiring electrode 11 is formed along the lower long side of the LED element 201b. Therefore, contrary to the light emitting surface of the LED element 201a, the light emitting surface of the LED element 201b has the brightness distribution that has a peak (the maximum brightness point) near the lower long side and wherein the brightness gradually decreases as it goes upward in the drawing.

The interval g (a width of the gap 7g) between the LED elements 201 is set to 150 μm or less similarly to the first embodiment and preferably to about 30 μm.

The wiring electrodes 8 are formed in parallel to oblique sides 2R and 2L of each parallelogram LED element 201 and not perpendicular to the upper side 2U and the lower side (base) 2B.

Acute angles of the parallelogram shape of each LED element 201 measure angle θ, and the angle θ are set in accordance with a relationship with the adjacent LED elements. For example, the acute angle θ is set so that a projection line L drawn from the vertex 2S of the acute angle (the acute angle of the upper side 2U) of the LED element 201a adjacent the LED element 201b crosses the lower side 2B of the adjacent LED element 201b. By doing that, the lights emitted from the adjacent LED elements overlap in the horizontal direction, and so the influence of the shadow generated by the gap 7g of the elements can be reduced. That is, the shadow by the gap 7g of the elements is likely to be canceled by the light emitted from the adjacent LED elements 201. Therefore, an influence of dark lines can be restrained.

In case that the projection line drawn perpendicularly from the vertex 2S does not cross the lower side 2B of the LED element 201b and passes through the gap 7g of the elements, the overlap of the light emitting surfaces in the horizontal direction is not occurred. In this case, the plane shape of the LED element becomes substantially the same as the oblong shape in the first embodiment, and so the effect of reducing the influence of the shadow by the gap 7g of the elements is weakened. In this case, the shadow by the gap 7g of the elements has a vertical direction component.

As described in the above, by making the plane shape of the light emitting surface of the LED element 201 the parallelogram with the acute angle of the angle θ with which the projection line L drawn perpendicularly from the vertex 2S of the acute angle of the upper side 2U crosses the lower side 2B of the adjacent LED element 201, it becomes possible to weaken the influence of the shadow by the gap 7g of the elements and also to obtain an uniformed light emitting surface of the LED array 200 as a whole with restraining the influence of the dark lines.

In the second embodiment, the term "parallelogram" represents not only a perfect parallelogram but also shapes approximating a parallelogram such as an approximate parallelogram having rounded or chamfered vertices and shapes with errors in manufacturing processes or in design.

FIG. 7A is a schematic plan view of an LED array 300 according to a third embodiment of the present invention, and FIG. 7B is a schematic plan view of LED elements 301a and 301b for explaining a plane shape of a light emitting surface of the LED array 300. The LED array 300 according to the third embodiment and the LED arrays 100 and 200 according to the first and second embodiments are different in the plane shapes of the LED elements and in the electrode patterns of the wiring electrodes 8, and other components of them and fabrication methods are the same. The below describes the plane shape of the LED element 301 and the electrode pattern of the wiring electrodes 8, and the explanations of the same components and processes are omitted.

In the third embodiment, by making the plane shape of the light emitting surface of the device structure layer 2 a trapezoid, each gap 7g between the LED elements 301 is angled in a plane of the projection surface. The LED element 301a is a 180-degree rotational symmetry of the LED element 301b.

The wide wiring electrode 11 is disposed along a long side of parallel sides of the trapezoid (an upper side 2U in the LED element 301a and a lower side (base) 2B in the LED element 301b), and the narrow wiring electrodes 8 extend from the wide wiring electrode 11 while decreasing their gaps gradually from the wide wiring electrode 11. Thus, the amount of injection current can be controlled by adjusting the electrode gaps in the vicinity of the wiring electrode 11 and the electrode gaps in the farthest position from the wiring electrode 11, and it can be considered that the brightness distribution in which the brightness decreases gradually from the wiring electrode 11 as in the first embodiment can be restrained.

The interval g (a width of the gap 7g) between the LED elements 301 is set to 150 μm or less similarly to the first embodiment and preferably to about 30 μm.

The wiring electrodes 8 are designed to be perpendicular to the upper and lower sides at the horizontal center and to be parallel to right or left oblique side as getting closer to the right or left oblique side. That is, the wiring electrodes 8 are disposed from one oblique side to another oblique side while continuously changing angles. In this embodiment, "along the short (or oblique) side" refers to this arrangement.

Acute angles of the trapezoid shape of each LED element 301 measure angle θ, and the angle θ are set in accordance with a relationship with the adjacent LED elements. For example, the acute angle θ is set so that a projection line L drawn from the vertex 2S of the acute angle (the right side acute angle of the upper side 2U) of the LED element 301a adjacent the LED element 301b crosses the lower side 2B of the adjacent LED element 301b. By doing that, the lights emitted from the adjacent LED elements overlap in the horizontal direction, and so the influence of the shadow generated by the gap 7g of the elements can be reduced. That is, the shadow by the gap 7g of the elements is likely to be canceled by the light emitted from the adjacent LED elements 301. Therefore, an influence of dark lines can be restrained.

In case that the projection line drawn perpendicularly from the vertex 2S does not cross the lower side 2B of the LED element 301b and passes through the gap 7g of the elements, the overlap of the light emitting surfaces in the horizontal direction is not occurred. In this case, the plane shape of the LED element becomes substantially the same as the oblong shape in the first embodiment, and so the effect of reducing the influence of the shadow by the gap 7g of the elements is weakened. In this case, the shadow by the gap 7g of the elements has a vertical direction component.

As described in the above, by making the plane shape of the light emitting surface of the LED element 301 the trapezoid with the acute angle of the angle θ with which the projection line L drawn perpendicularly from the vertex 2S of the acute angle of the upper side 2U crosses the lower side 2B of the adjacent LED element 301, it becomes possible to weaken the influence of the shadow by the gap 7g of the elements and also to obtain an uniformed light emitting surface of the LED array 300 as a whole with restraining the influence of the dark lines.

In the third embodiment, the term "trapezoid" represents not only a perfect trapezoid but also shapes approximating a trapezoid such as an approximate trapezoid having rounded or chamfered vertices and shapes with errors in manufacturing processes or in design. Moreover, it is not limited to an isosceles trapezoid.

As described in the above, the first to the third embodiments of the present invention utilize the electrode pattern wherein the wide wiring electrode 11 is disposed along the long side of each LED element 101 in parallel to the long side to diffuse electric current in the direction of the long side, and the narrow wiring electrodes 8 are disposed in parallel to the short side or along the short side to inject the electric current to the light emitting part 2. Therefore, the wiring resistance of the wiring electrodes 8 can be lowered by reducing the length of the wiring electrodes 8, and the uneven brightness distribution of each LED element 101 can be considerably reduced.

Moreover, the wiring electrodes (the first electrode layers) are disposed on different long sides in the adjacent LED elements. Therefore, the vertical brightness distributions of the adjacent elements are turned upside down, and so the uneven brightness distribution of the LED array can be reduced.

Further, the wiring electrode 11 is disposed along the long side of each LED element 101, the interval g between the LED elements 101 can be narrowed and thereby the decrease in the brightness in the interval between the LED elements 101 and in the regions around the interval can be restrained.

Furthermore, the uneven brightness in a projection image can be reduced by composing the headlamp 50 with two LED arrays 100 whose electrode patterns (brightness distributions) are turned upside down (180-degree rotational symmetry) and whose projection images are projected onto the same position of the projection surface 107 to overlap each other.

Moreover, according to the second and the third embodiments of the present invention, the acute angle is set to make the projection line drawn perpendicularly from the vertex of the acute angle of the upper side of each LED element cross the lower side (base) of the adjacent LED element. By that, lights emitted by the adjacent LED elements overlap over the interval between the LED elements to weaken the influence of the shadow by the gap between the elements, and it becomes possible to cancel the shadow by the gap between the elements by interaction of the adjacent LED elements. Therefore, the influence of the dark lines can be restrained.

Further, in the above-described second and third embodiments, the plane shape of the light emitting surface is a parallelogram or a trapezoid; however, the plane shape is not limited to those. The plane shape of any shape can be used as far as a plane shape has at least two sides parallel to the long side of the oblong LED array and an oblique side not perpendicular to the long side while a gap between the plane shapes is angled in a projection surface when the plane shape and its 180-degree rotated shape are alternatively arranged.

Furthermore, the sides of the light emitting surface which are not parallel to the long sides of the oblong LED array can consist of curved lines other than straight lines. Moreover, those sides may consist of a combination of a straight line and a curved line or a combination of straight lines having different angles of inclination. The sides can consist of any kind of line which has at least a portion angled from the long side of the LED array.

Figure 8A:
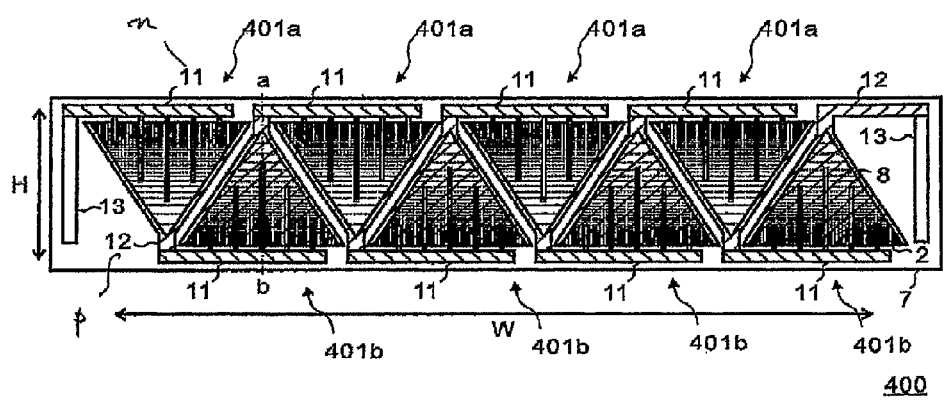
FIG. 8A to FIG. 8C are schematic plan view, circuit diagram and cross sectional view of an LED array 400 and LED elements 401 according to a fourth embodiment of the present invention.
Figure 8B:
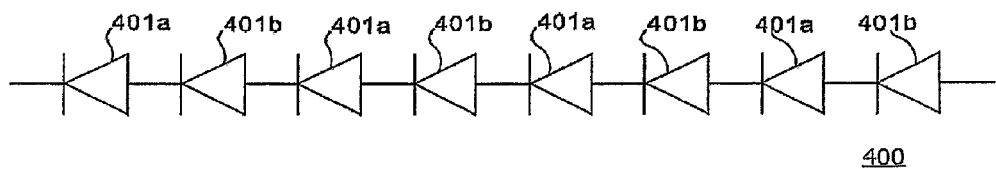
Figure 8C:
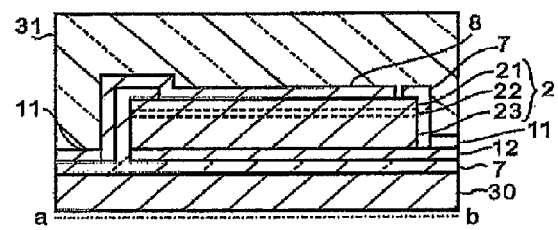

FIG. 8A is a schematic plan view of an LED array 400 according to a fourth embodiment of the present invention, and FIG. 8B is a circuit diagram of the LED array 400. FIG. 8C a simplified cross sectional view of the LED array 400 cut along a line a-b in FIG. 8A. Moreover, hatching of the light emitting part 2 in FIG. 8A indicates brightness distribution wherein increase in density of hatching indicates increase in brightness.

The LED (light emitting diode) array (light emitting element array) 400 according to the fourth embodiment of the present invention is an array of eight nitride semiconductor light emitting elements (LED elements) 401 (401a and 401b) connected in series and arranged along a W direction in the drawing on a supporting substrate 30 which is long in the W direction and on which an insulating layer 7 is formed.

Each one of the LED elements 401 is a triangle which has a base parallel to a side of the supporting substrate 30 along the direction W and consists of a GaN-based light emitting part (device structure layer) 2 including an n-type GaN layer 21, an active layer 22 and a p-type GaN layer 23, a p-electrode 12 formed on a back surface of the light emitting part 2 and exposed (or projecting) from a vertex of the triangle on a top or a bottom side of the light emitting part 2, a wiring electrode (first wiring layer) 11 disposed in parallel to the base of the triangle at a position with a predetermined interval from the base which is opposite from the vertex where the p-electrode 12 is exposed, and wiring electrodes (second wiring layers) 8 disposed on a surface of the light emitting part 2 in parallel to a short side of the LED array 400 and connecting the n-type GaN layer 21 and the wiring electrode 11.

A phosphor layer 31 seals the plurality of the LED elements 401 mounted on the substrate 30. For example, when the LED elements 401 are blue LED elements, the white LED array 400 can be fabricated by a combination of the blue LED elements and yellow phosphor. In this case, the yellow phosphor is added to transparent resin in advance, and the LED elements 401 are sealed by the transparent resin added with the phosphor.

Each LED element 401 is electrically connected in series to the LED elements 401 adjacent to its left and right. The wiring electrode 11 of the LED element 401a is electrically connected to the p-electrode 12 of the LED element 401b on the left, and the p-electrode 12 of the LED element 401a is electrically connected to the wiring electrode 11 of the LED element 401b on the right. The p-electrode 12 of the LED element 401a at the end and the wiring electrode 11 of the LED element 401b at the end are electrically connected to power supply pads 13 respectively.

Regarding the LED element 401a, an injection current gradually decreases from the top to the bottom of the drawing because the wiring electrode 11, the power supply side, is disposed along and in parallel to the upper long side of the LED array 400, and the wiring electrodes 8 extending from the wiring electrode 11 to the n-type GaN layer 21 are disposed in parallel to the short side of the LED array 400. Because the plane shape of the light emitting part 2 is a triangle, the width of the light emitting part decreases as getting downward, and the brightness decreases in the vicinity of the vertex of the triangle. Therefore, the LED element 401a has a brightness distribution wherein the upper side is bright and the lower side is dark.

Regarding the LED element 401b, contrary to the LED element 401a, an injection current gradually decreases from the bottom to the top of the drawing because the wiring electrode 11, the power supply side, is disposed along and in parallel to the lower long side of the LED array 400, and the wiring electrodes 8 extending from the wiring electrode 11 to the n-type GaN layer 21 are disposed in parallel to the short side of the LED array 400. Because the plane shape of the light emitting part 2 is a triangle, the width of the light emitting part decreases as getting upward, and the brightness decreases in the vicinity of the vertex of the triangle. Therefore, the LED element 401b has a brightness distribution wherein the lower side is bright and the upper side is dark.

That is, on a light emitting surface of the LED element 401a is formed a brightness distribution that has a peak (the maximum brightness point) near the wiring electrode 11 and wherein the brightness gradually decreases as it goes further from the wiring electrode 11 downward (to a direction H) in the drawing.

Although the similar brightness distribution is formed on the light emitting surface of the LED element 401b as the LED element 401a, the wiring electrode 11 is formed along the lower long side of the LED element 401b. Therefore, contrary to the light emitting surface of the LED element 401a, the light emitting surface of the LED element 401b has the brightness distribution that has a peak (the maximum brightness point) near the lower long side and wherein the brightness gradually decreases as it goes upward in the drawing.

Moreover, the LED element 401a and the LED element 401b basically has the same structures except the electrode patterns such as positions of the p-electrodes 12, wiring electrodes 11 and the wiring electrodes 8. The electrode pattern of the LED element 401b is upside-down (180-degree rotational symmetry) of that of the LED element 401a.

That is, the LED elements 401a and LED elements 401b are alternatively disposed along the long side of the LED array 400. Each LED element 401a has the wiring electrode (first wiring layer) 11 disposed along one long side of the light emitting part 2 (the lower long side in FIG. 8A) and the wiring electrodes (second wiring layer) 8 extending from the one long side to vicinity of another long side, whereas each LED element 401b has the wiring electrode (first wiring layer) 11 disposed along the another long side of the light emitting part 2 (the upper long side in FIG. 8A) and the wiring electrodes (second wiring layer) 8 extending from the another long side to vicinity of the one long side.

Figure 9A:
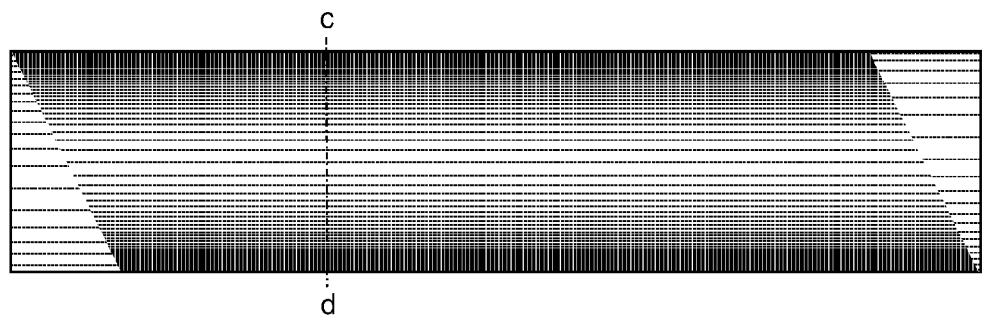
FIG. 9A to FIG. 9C are diagrams schematically showing brightness distributions of the LED array 400 according the fourth embodiment of the present invention.
Figure 9B:
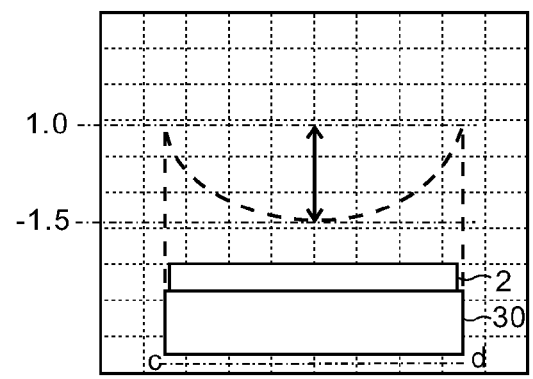

FIG. 9A is a plan view showing brightness distribution in a blue color of The LED array 400 without the phosphor layer 31 according to the fourth embodiment of the present invention. FIG. 9B is a diagram schematically showing the brightness distribution in a blue color along the line c-d in FIG. 9A of the LED array 400 without phosphor layer 31. Moreover, hatching in FIG. 9A indicates brightness distribution wherein increase in density of hatching indicates increase in brightness.

By arranging the LED elements 401 as shown in FIG. 8A, a region with very low brightness near the vertex of the light emitting part 2 is placed between regions with high brightness neat the bases of the adjacent LED elements 401. Although the brightness is very low in the region near the vertex, the brightness of the whole LED array 400 is not lowered in that region because the width of the region in the direction W is very narrow and light from the regions near the bases of the adjacent LED elements 401 diffuses. On the other hand, in the central region of the light emitting part 2 in the direction H, any one of adjacent LED elements has lower brightness comparing to the region near the base; therefore, as shown in FIG. 9A, the blue LED array 400 without the phosphor layer 31 as a whole has low brightness in the region near the center in the direction H comparing to the region near the base.

In the fourth embodiment of the present invention as shown in FIG. 9B, the brightness (the reference brightness) in the region near the center in the direction H is designed to be about 0.6 to 0.83 times (e.g., 0.67 times in the fourth embodiment) of the brightness (the highest brightness) in the region near the base. That is, an M-shaped brightness distribution that is a counterpart of the lambertian distribution (the brightness distribution in which the brightness gradually decreases from the center to the periphery) is deliberately formed.

Figure 9C:
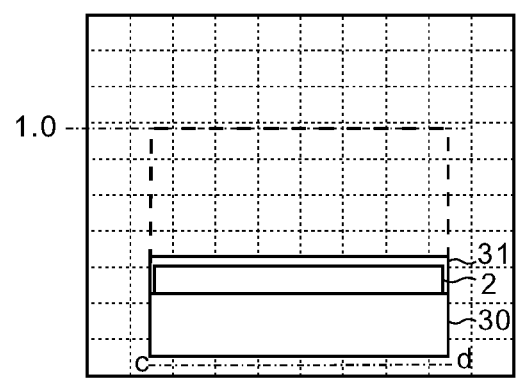
Figure 10A:
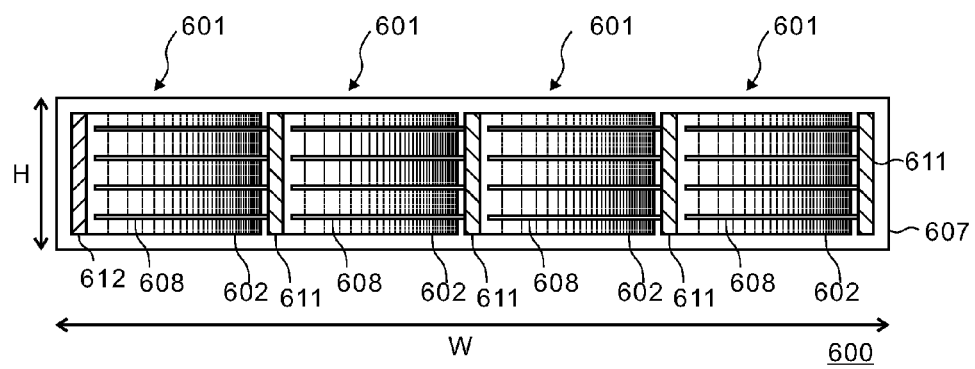
FIG. 10A to FIG. 10D are schematic plan view, cross sectional view and brightness distributions of an LED array 600 and LED elements 601 according to a prior art.
Figure 10B:
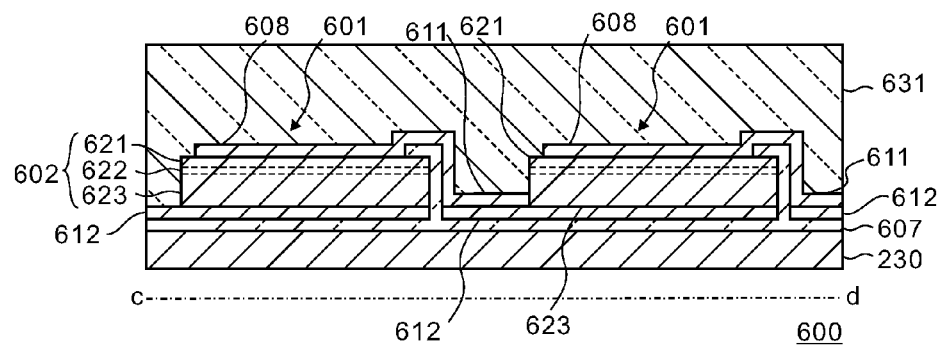
Figure 10C:
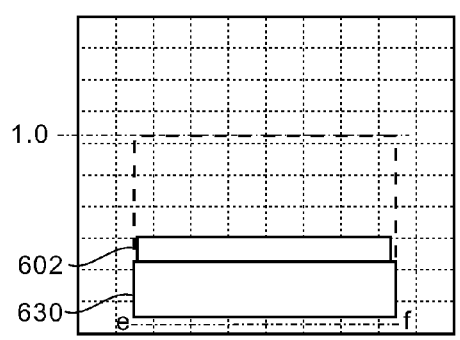
Figure 10D:
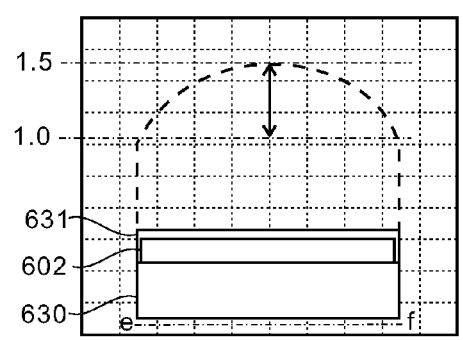

When the phosphor layer 31 is formed, the brightness of the center in the direction H becomes about 1.2 to 1.67 times (in this embodiment, about 1.5 times) of the brightness in the region near the base as shown in FIG. 10D. Therefore, by deliberately forming the brightness distribution to make the brightness (the reference brightness) in the region near the center about 0.67 times of the brightness (the highest brightness) in the region near the base when the LED array 400 emits blue light without the phosphor layer 31, it becomes possible to flatten the brightness distribution as shown in FIG. 9C when the LED array 400 emits white light after forming the phosphor layer 31.

In this specification, the triangle is not limited to a perfect triangle but also includes errors in design or in manufacturing processes and an approximate triangle such as a triangle with rounded or chamfered vertices. Moreover, the triangle is not limited to an equilateral triangle but also an isosceles triangle, a right triangle, or the likes. That is, the triangle in this specification includes a triangular shape whose base is disposed in parallel to one long side of the LED array 400 and vertex opposite the base is disposed on another long side.

According to the fourth embodiment, the interval between the LED elements 401 can be narrowed by disposing the wiring electrode 11 along the long side of the LED element 401 comparing to the prior art in which the wiring electrode 11 is disposed along the short side of the element. Therefore, the decrease in the brightness in the region between the LED elements 401 can be restrained.

Moreover, the LED array 400 according to the fourth embodiment of the present invention can be used in the automotive lighting (headlamp) 50 as shown in FIG. 2B similarly to the above-described first to the third embodiments. In this case, one LED array 400 according to the fourth embodiment is used as the light source 102 shown in FIG. 2B.

Moreover, the LED array 400 according to the fourth embodiment of the present invention can be fabricated by the similar processes shown in FIG. 3A to FIG. 4D as the above-described first to third embodiments.

In case of fabricating the LED array 400 according to the fourth embodiment, in the process shown in FIG. 3C, the device structure layer 2 is divided into a plurality of triangular-shaped elements by the dry-etching technique by using a resist mask and chlorine gas. Moreover, after the process shown in FIG. 4D, The plurality of LED elements 401 mounted on the substrate 30 are sealed by the phosphor layer (the phosphor containing resin) 31. After sealing the LED elements 401 with the phosphor layer 31, the phosphor layer 31 is cured by a high temperature and then the fabrication of the LED array 400 is completed.

A thickness of the phosphor layer 31 is, for example, set to 20 to 200 μm and preferably to about 50 to 100 μm. Moreover, the phosphor containing resin is prepared by mixing the resin with the phosphor measured to obtain color temperature required for a transparent resin material by agitation. Silicone, epoxy or silicone/epoxy hybrid resin is preferably used for the material of the transparent resin. As the yellow phosphor, it is preferable to use yttrium aluminum garnet (YAG) based phosphor. Moreover, the phosphor containing resin can be added further with thickening agent, dispersing agent or the likes. The LED elements 401 can be sealed by printing, dispensing, or the likes and preferably by printing in consideration of accuracy of dimension. Moreover, it is not changed that the brightness in the center is about 1.5 times of the brightness in the periphery if the manufacturing condition of the phosphor layer 31 such as material, thickness or the likes varies.

Moreover, the device structure layer 2 may be processed to have only one long sidewall spreading outside toward the bottom as shown in FIG. 5 similarly to the above-described first to third embodiments.

As described in the above, according to the fourth embodiment of the present invention, by making the plane shape of the light emitting part 2 a shape whose base is along and parallel to one long side of the oblong LED array 400 and whose vertex opposite the base is disposed along another long side (e.g., a triangle), the maximum brightness regions having 1.2 to 1.67 times of the reference rightness are formed near the long sides of the oblong LED array 400 in the brightness distribution of the oblong LED array 400 having a plurality of blue LED elements 401 before forming the phosphor layer 31 to make them emit white light when the brightness of the vertical center (the center in the short side direction) is defined as the reference brightness. Thus, in case that the LED array 400 is made to emit white light by forming the phosphor layer 31, a flat brightness distribution for a white color can be obtained.

Moreover, the decrease in the brightness in the region between the LED elements 401 can be restrained by narrowing the gap g between the LED elements 401 by forming the wiring electrode 11 along the long side of the LED element 401.

Furthermore, the oblique sides of the light emitting surface can consist of curved lines other than straight lines. Moreover, those sides may consist of a combination of a straight line and a curved line or a combination of straight lines having different angles of inclination. The sides can consist of any kind of line which has at least a portion angled from the long side of the LED array. That is, the plane shape of the light emitting surface 2 is not limited to a triangle or approximate triangles but also a pentagon like a home base shape, a rectangle one of whose vertex is an acute angle, trapezoid or any shapes which has a base parallel to the long side of the LED array 400 and at least one side having a portion inclined to a line perpendicular to the base and whose horizontal width decreases as getting further from the base.

The present invention has been described in connection with the preferred embodiments. The invention is not limited only to the above embodiments. It is apparent that various modifications, improvements, combinations, and the like can be made by those skilled in the art.

What are claimed are:

1. A semiconductor light emitting element array comprising:
   an oblong substrate that is long in a first direction; and a plurality of semiconductor light emitting elements which are disposed on the oblong substrate, and aligned along the first direction, wherein each of the light emitting elements comprises:

an electrode layer formed on the substrate;

a semiconductor light emitting layer formed on the electrode layer and having a pair of long sides parallel to the first direction, the semiconductor light emitting layer comprising a p-type semiconductor layer electrically connected to the electrode layer, an active layer formed on the p-type semiconductor layer, and an n-type semiconductor layer formed on the active layer;

a first wiring layer formed on the substrate along and in parallel to one of the long sides of the semiconductor light emitting layer parallel to the first direction; and a plurality of second wiring layers which extend from the first wiring layer onto the semiconductor light emitting layer and which are electrically connected to the n-type semiconductor layer on a surface of the semiconductor light emitting layer;

wherein:

a plane shape of the semiconductor light emitting layer comprises the long sides which are upper and lower sides parallel to the first direction and two short sides including a portion inclined from an imaginary line perpendicular to the upper and the lower sides, the second wiring layers are disposed parallel to the short sides or perpendicular to the first direction, and an imaginary vertical line extending from a vertex of one of the light emitting elements where the upper side and the short side of said one of the light emitting elements meet crosses the lower side of said one of the light emitting element or crosses the lower side of another one of the light emitting elements which is adjacent to said one of the light emitting elements.

2. The semiconductor light emitting element array according to claim 1, wherein the plane shape of the semiconductor light emitting layer is a parallelogram.

3. The semiconductor light emitting element array according to claim 1, wherein the plane shape of the semiconductor light emitting layer is a trapezoid.

4. The semiconductor light emitting element array according to claim 1, wherein:

the first wiring layer of each light emitting element is formed along either one of the upper and lower sides of the semiconductor light emitting layer and in parallel to said one of the upper and lower sides, the second wiring layers extend from the first wiring layer onto the semiconductor light emitting layer, and the first wiring layers of the adjacent light emitting elements are alternatively disposed along upper and lower sides.

5. The semiconductor light emitting element array according to claim 1, wherein:

the first wiring layer one of the light emitting elements is electrically connected to the electrode layer of another one of the light emitting elements which is adjacent to said one of the light emitting elements, and the plurality of the light emitting elements are connected in series.

6. The semiconductor light emitting element array according to claim 1, wherein the semiconductor light emitting layer includes GaN, and the semiconductor light emitting element array further comprises transparent resin to which phosphor is added, and which seals the semiconductor light emitting elements.

7. A semiconductor light emitting element array comprising:

an oblong substrate that is long in a first direction;

an array of parallelogram-shaped semiconductor light emitting elements disposed on the substrate along the first direction, with a gap of substantially constant width between each pair of adjacent parallelogram-shaped semiconductor light emitting elements;

a pair of pad areas defined on the substrate at regions outside the array in the first direction; and a pair of power supply pads disposed in the pad areas;

wherein each of the parallelogram-shaped semiconductor light emitting elements comprises an electrode layer formed on the substrate, and a semiconductor light emitting layer formed on the electrode layer, the semiconductor light emitting layer including a p-type semiconductor layer disposed on and electrically connected to the electrode layer, an active layer formed on the p-type semiconductor layer, and an n-type semiconductor layer formed on the active layer, wherein the semiconductor light emitting layer has long parallel sides disposed along the first direction, and oblique parallel short sides disposed along a direction crossing the first direction at a non-orthogonal angle, wherein each of the parallelogram-shaped semiconductor light emitting elements further comprises a first wiring layer formed on the substrate along and in parallel to one of the long sides of the semiconductor light emitting layer, and a plurality of second wiring layers extending from the first wiring layer onto the semiconductor light emitting layer and electrically connected to the n-type semiconductor.

8. The semiconductor light emitting element array according to claim 7, wherein each said electrode layer extends outside of the semiconductor light emitting layer on a side opposite to a side of the corresponding first wiring layer, and in the whole semiconductor light emitting element array, the electrode layers and the first wiring layers for the plurality of semiconductor light emitting elements are alternately disposed on both sides of the semiconductor layers.

9. The semiconductor light emitting element array according to claim 7, wherein the substrate has a rectangular shape having long sides and short sides, and the pad areas are defined between the short sides of the substrate and the array.

* * * * *